(12) United States Patent
Wang

(10) Patent No.: US 10,923,681 B2
(45) Date of Patent: Feb. 16, 2021

(54) PACKAGING METHOD OF OLED DISPLAY DEVICE USING SACRIFICIAL LAYER IN BONDING REGION

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Yulin Wang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/328,038

(22) PCT Filed: May 29, 2018

(86) PCT No.: PCT/CN2018/088850
§ 371 (c)(1),
(2) Date: Feb. 25, 2019

(87) PCT Pub. No.: WO2018/219270
PCT Pub. Date: Dec. 6, 2018

(65) Prior Publication Data
US 2019/0221775 A1    Jul. 18, 2019

(30) Foreign Application Priority Data
Jun. 2, 2017    (CN) .......................... 201710408525.2

(51) Int. Cl.
*H01L 51/56*    (2006.01)
*H01L 51/52*    (2006.01)

(52) U.S. Cl.
CPC ........ *H01L 51/5256* (2013.01); *H01L 51/524* (2013.01); *H01L 51/5237* (2013.01);
(Continued)

(58) Field of Classification Search
CPC .. H01L 51/5256; H01L 51/5246; H01L 51/56
See application file for complete search history.

(56) References Cited

U.S. PATENT DOCUMENTS

| 2016/0141550 A1 | 5/2016 | Fujino et al. |
| 2016/0190179 A1 | 6/2016 | Kim et al. |

(Continued)

FOREIGN PATENT DOCUMENTS

| CN | 101692446 A | 4/2010 |
| CN | 104022233 A | 9/2014 |

(Continued)

OTHER PUBLICATIONS

First Office Action for Chinese Application No. 201710408525.2, dated May 22, 2018, 6 Pages.
(Continued)

*Primary Examiner* — Michael Jung
(74) *Attorney, Agent, or Firm* — Brooks Kushman P.C.

(57) ABSTRACT

The present disclosure provides a package structure and a packaging method of OLED display device, and a display device. The packaging method of OLED display device includes providing a substrate including a package region and a bonding region around the package region, the package region being provided with a bonding electrode lead; forming a sacrificial layer on the bonding electrode lead; forming an OLED display device in the package region; forming a packaging film which covers the package region and the bonding region; and removing the sacrificial layer to separate the sacrificial layer and a part of the packaging film positioned on the sacrificial layer from the substrate. The
(Continued)

packaging method of OLED display device provided is used for packaging OLED display devices.

11 Claims, 3 Drawing Sheets

(52) U.S. Cl.
CPC .......... *H01L 51/5246* (2013.01); *H01L 51/56* (2013.01); *H01L 51/5203* (2013.01); *H01L 2251/56* (2013.01)

(56) References Cited

U.S. PATENT DOCUMENTS

| | | | |
|---|---|---|---|
| 2017/0179425 | A1 | 6/2017 | Quan et al. |
| 2017/0179430 | A1* | 6/2017 | Lee .................... H01L 27/3246 |
| 2017/0194579 | A1 | 7/2017 | Wang |
| 2019/0165321 | A1* | 5/2019 | Choi ................... H01L 51/5271 |

FOREIGN PATENT DOCUMENTS

| | | |
|---|---|---|
| CN | 104393187 A | 3/2015 |
| CN | 104485347 A | 4/2015 |
| CN | 105322104 A | 2/2016 |
| CN | 105633281 A | 6/2016 |
| CN | 107104202 A | 8/2017 |
| KR | 20120116782 A | 10/2012 |

OTHER PUBLICATIONS

International Search Report and Written Opinion for Application No. PCT/CN2018/088850, dated Aug. 22, 2018, 10 Pages.

* cited by examiner

PACKAGING METHOD OF OLED DISPLAY DEVICE USING SACRIFICIAL LAYER IN BONDING REGION

CROSS-REFERENCE TO RELATED APPLICATION APPLICATIONS

This application is the U.S. national phase of PCT Application No. PCT/CN2018/088850 filed on May 29, 2018, which claims priority to Chinese Patent Application No. 201710408525.2 filed on Jun. 2, 2017, which are incorporated herein by reference in their entireties.

TECHNICAL FIELD

The present disclosure relates to the field of display technology, in particular to a package structure and a packaging method of OLED display device, and a display device.

BACKGROUND

Organic light-emitting diode (OLED) display devices have various advantages such as low power consumption, high contrast and wide viewing angle, and receive much interest currently. In an OLED display device, an organic light-emitting layer is made of organic light-emitting materials, and emits light when electrons and holes are combined therein, so as to realize a display function of the OLED display device. Since the organic light-emitting materials are sensitive to water and oxygen, it is necessary to perform a packaging process to the OLED display device after manufacturing thereof is completed, so as to isolate the organic light-emitting layer from outside water and oxygen, thereby ensuring service life of the OLED display device.

A packaging process in related art generally comprises covering an OLED display device to be packaged with a mask, and depositing a packaging film on the OLED display device to be packaged by means of low temperature chemical vapor deposition (CVD) or atomic layer deposition (ALD), so as to achieve packaging of the OLED display device. However, due to the process of CVD or ALD itself, residual particles are generated at edges of the mask during the process of depositing the packaging film, and are very likely to cause water and oxygen to enter the OLED display device, which affects the service life of the OLED display device.

SUMMARY

The present disclosure provides a packaging method of OLED display device, comprising providing a substrate including a package region and a bonding region around the package region, the package region being provided with a bonding electrode lead; forming a sacrificial layer on the bonding electrode lead; forming an OLED display device in the package region; forming a packaging film which covers the package region and the bonding region; and removing the sacrificial layer to separate the sacrificial layer and a part of the packaging film positioned on the sacrificial layer from the substrate.

Optionally, after forming the packaging film which covers the package region and the bonding region and before removing the sacrificial layer, the packaging method further comprises forming an adhering layer on a part of the packaging film positioned in the package region; and covering the adhering layer with a packaging cover plate.

Optionally, after removing the sacrificial layer, the packaging method further comprises cleaning the substrate from which the sacrificial layer has been removed; and forming an adhering layer on a part of the packaging film positioned in the package region; and covering the adhering layer with a packaging cover plate.

Optionally, the package region includes a display region and a non-display region around the display region, and the adhering layer comprises a filler layer positioned in the display region and a sealant layer positioned in the non-display region of the substrate; or, the adhering layer is a surface mount adhesive layer.

Optionally, the step of forming the sacrificial layer on the bonding electrode lead comprises forming a sacrificial film by using a photosensitive adhesive; irradiating the sacrificial film with ultraviolet light to form a cured sacrificial film; patterning the cured sacrificial film to form the sacrificial layer; and cleaning the substrate on which the sacrificial layer is formed.

Optionally, the step of forming the sacrificial layer on the bonding electrode lead comprises forming a pattern of sacrificial film with an organic solution by means of inkjet printing; and curing the pattern of sacrificial film to form the sacrificial layer.

Optionally, the step of removing the sacrificial layer comprises soaking the sacrificial layer in an alkaline solution, or mechanically stripping the sacrificial layer, so as to remove the sacrificial layer.

Optionally, the step of forming the packaging film which covers the package region and the bonding region comprises forming a single-layer inorganic packaging film; or, forming a multilayer packaging film composed of alternately stacked inorganic packaging films and organic packaging films, with at least one of the inorganic packaging films completely covering the organic packaging films.

Optionally, at least one of the inorganic packaging films is in direct contact with the OLED display device.

Optionally, an orthographic projection of the organic packaging film on the substrate falls within an orthographic projection of the inorganic packaging film on the substrate.

The present disclosure further provides a package structure for OLED display device, which is manufactured with the aforesaid packaging method of OLED display device, and comprises a packaging film covering an OLED display device, wherein at least a part of an orthographic projection of a bonding electrode lead positioned in a bonding region on a substrate is beyond an orthographic projection of the packaging film on the substrate.

The present disclosure further provides a display device, comprising the aforesaid package structure for OLED display device, and a driving chip bonded with the bonding electrode lead therein.

BRIEF DESCRIPTION OF THE DRAWINGS

The drawings described herein are provided for further understanding of the present disclosure, and form a part of the present disclosure. Exemplary embodiments and description thereof of the present disclosure are intended for interpretation of the present disclosure, but do not make improper limitation to the present disclosure. In the drawings.

DETAILED DESCRIPTION

In order to further explain the package structure and the packaging method of OLED display device and the display device provided by embodiments of the present disclosure, detailed description will be presented below with reference to the accompanying drawings.

As stated in the BACKGROUND, the packaging process in related art comprises covering an OLED display device to be packaged with a mask, and depositing a packaging film in a package region of the OLED display device to be packaged by means of CVD or ALD, so as to achieve packaging the OLED display device. CVD is a technology which comprises introducing one or more compounds containing elements for forming the films, and elementary gases into a reaction chamber where a substrate is disposed, and depositing a solid film on a surface of the substrate by means of spatial gas phase chemical reaction; and ALD is a technology which comprises alternately introducing vapor phase precursors into a reactor, depositing the vapor phase precursors on a surface of a substrate positioned in the reactor, and subjecting the vapor phase precursors to chemical adsorption and surface reaction on the surface of the substrate, so as to form a deposited film. However, due to the process of CVD or ALD itself, when the packaging film is deposited in the package region of the OLED display device by means of CVD or ALD, it is very likely to generate residual particles at edges of the mask, which may affect the service life of the OLED display device.

It is found through research by the inventor of the present disclosure that, during the packaging process, no residual particles are generated by adopting CVD or ALD to form the packaging film if the OLED display device to be packaged is not covered with the mask. Based on the above conclusion, it is found through further research by the inventor that, during the packaging process of the OLED display device, by providing a sacrificial layer in a non-package region (i.e., a bonding region) of the OLED display device, a packaging film which covers all regions of the OLED display device may be formed while adopting CVD or ALD to form the packaging film, thereby occurrence of the residual particles can be avoided; furthermore, the sacrificial layer and a part of the packaging film positioned on the sacrificial layer may be totally removed after the OLED display device is packaged, so that packaging effects on the OLED display device may are guaranteed, and subsequent bonding operation may be normally performed to the packaged OLED display device.

Figure 1:
FIG. 1 is a schematic structural diagram of a package structure for OLED display device provided by some embodiments of the present disclosure, which corresponds to step 101.
Figure 2:
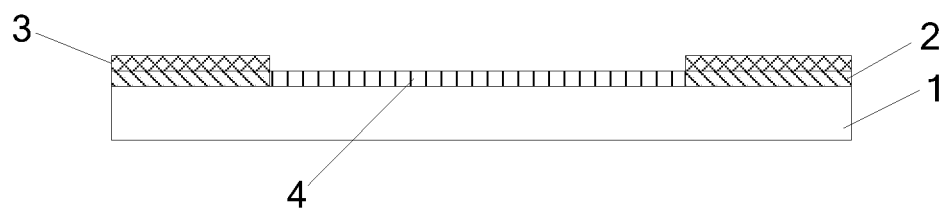
FIG. 2 is a schematic structural diagram of a package structure for OLED display device provided by some embodiments of the present disclosure, which corresponds to steps 102 and 103.
Figure 3:
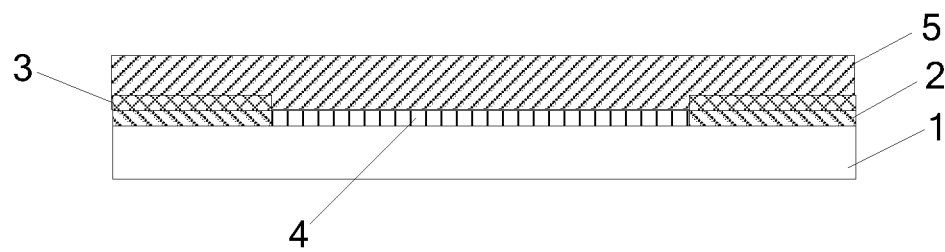
FIG. 3 is a schematic structural diagram of a package structure for OLED display device provided by some embodiments of the present disclosure, which corresponds to step 104.
Figure 6:
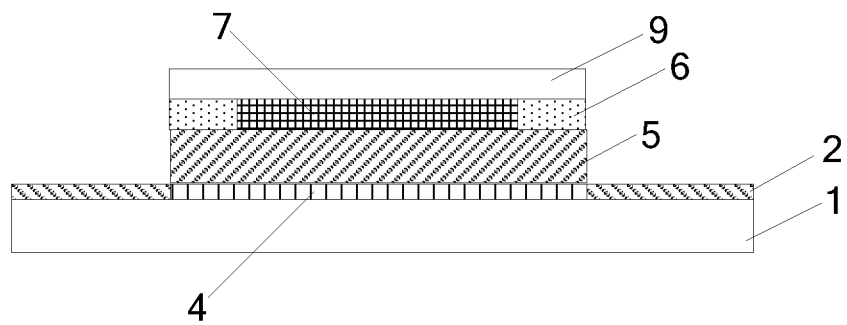
FIG. 6 is a schematic structural diagram of a package structure for OLED display device provided by some embodiments of the present disclosure (corresponding to FIG. 4), after a sacrificial layer is removed.
Figure 7:
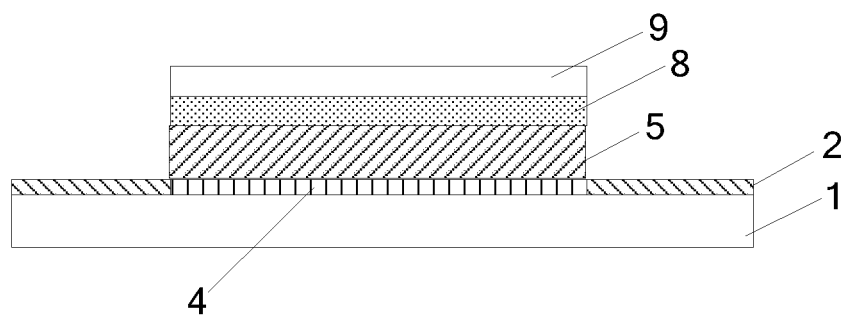
FIG. 7 is a schematic structural diagram of a package structure for OLED display device provided by some embodiments of the present disclosure (corresponding to FIG. 5), after a sacrificial layer is removed.

A packaging method of OLED display device provided by some embodiments of the present disclosure comprises:

step 101, as shown in FIG. 1, providing a substrate 1 including a package region and a bonding region around the package region, the package region being provided with a bonding electrode lead 2;

step 102, as shown in FIG. 2, forming a sacrificial layer 3 on the bonding electrode lead 2;

step 103, forming an OLED display device 4 in the package region;

step 104, as shown in FIG. 3, forming a packaging film 5 which covers all regions of the substrate 1; and step 105, as shown in FIGS. 6 and 7, removing the sacrificial layer 3 to separate the sacrificial layer 3 and a part of the packaging film 5 positioned on the sacrificial layer 3 from the substrate 1.

In some embodiments of the present disclosure, in step 101, the substrate 1 may be a glass substrate 1 which is provided with the bonding electrode lead 2 in the bonding region thereof; in step 102, coating or inkjet printing may be adopted to form the sacrificial layer 3 on the bonding electrode lead 2; in step 103, the obtained OLED display device 4 comprises at least a pixel driving circuit formed on a surface of the substrate 1, and a planarization layer, an anode, an organic light-emitting layer and a cathode sequentially formed on the pixel driving circuit; wherein, the pixel driving circuit, the planarization layer and the anode and the bonding electrode lead 2 positioned in the bonding region of the substrate 1 may be formed at the same time, that is, the substrate 1 formed in step 101 is provided with the pixel driving circuit, the planarization layer, the anode and the bonding electrode lead 2; when the pixel driving circuit, the planarization layer and the anode are formed before step 103, the organic light-emitting layer and the cathode may be formed directly on the anode in step 103, so as to obtain a complete OLED display device; in step 104, the packaging film 5 which covers all regions of the substrate 1 may be directly formed without using a mask; in step 105, the sacrificial layer 3 may be removed by soaking the sacrificial layer 3 in an alkaline solution, or by mechanical stripping, depending upon the material of the sacrificial layer 3; wherein, in the case of soaking the sacrificial layer 3 in an alkaline solution, the alkaline solution may penetrate into the sacrificial layer 3 from exposed edges thereof regardless of the packaging film 5 formed on the sacrificial layer 3, so as to gradually dissolve the sacrificial layer 3.

According to the packaging method of OLED display device provided by some embodiments of the present disclosure, the sacrificial layer 3 is firstly formed on the bonding electrode lead 2 positioned in the bonding region of the substrate 1, and then a complete OLED display device 4 is formed in the package region, which avoids influences of exposing and development processes to the organic light-emitting layer of the OLED display device 4 during formation of the sacrificial layer 3. After the sacrificial layer 3 and the OLED display device 4 are formed, the packaging method of OLED display device provided by some embodiments of the present disclosure enables direct formation of the packaging film 5 which covers all regions of the substrate 1 without using a mask, so as to prevent occurrence of residual particles caused by the presence of the mask, and guarantee good packaging effects of the packaging film 5 on the OLED display device 4. Finally, the sacrificial layer 3 is removed, so as to separate the sacrificial layer 3 and the part of the packaging film 5 positioned on the sacrificial layer 3 from the substrate 1, enabling that subsequent bonding operation may be normally performed to the bonding electrode lead 2 positioned in the bonding region of the substrate 1.

Moreover, according to the packaging method of OLED display device provided by some embodiments of the present disclosure, no mask is used, and correspondingly an alignment process of the mask is not needed. Therefore, when the OLED display device 4 is packaged by using the packaging method, there is no need for high-precision alignment system, mask carrying system and transporting system, nor any need for corresponding process protection, so that packaging cost of the OLED display device 4 is reduced. Moreover, the alignment process of the mask is eliminated in the packaging process, which not only increases packaging efficiency of the OLED display device 4, but also obviates the need for reserving an alignment dot region on the substrate 1 for mask alignment, so as to leave more space for design of the substrate 1.

Figure 4:
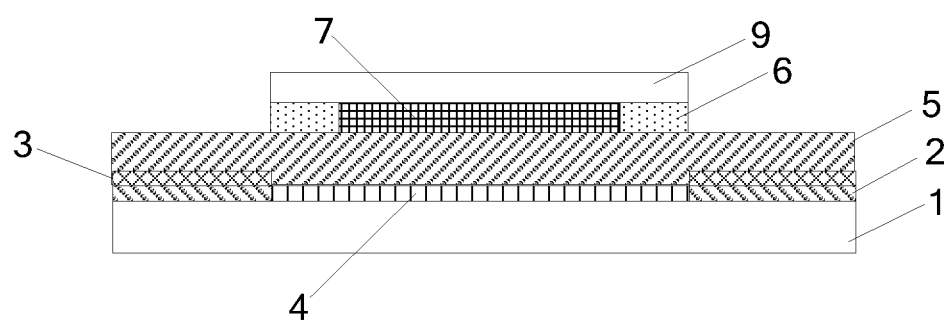
FIG. 4 is a first schematic structural diagram of a package structure for OLED display device provided by some embodiments of the present disclosure, which comprises a packaging cover plate.
Figure 5:
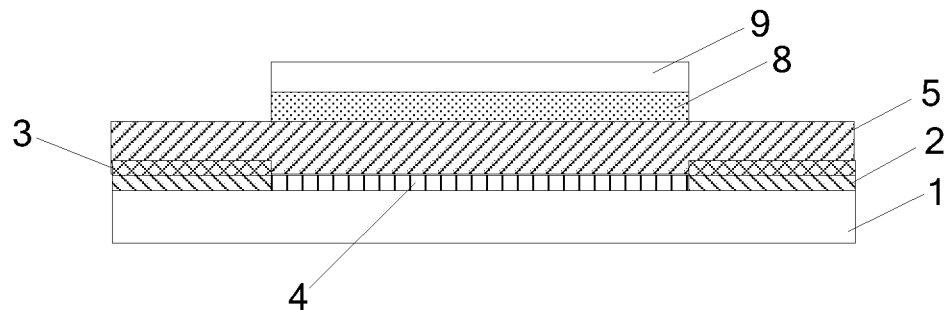
FIG. 5 is a second schematic structural diagram of a package structure for OLED display device provided by some embodiments of the present disclosure, which comprises a packaging cover plate.

For further improving the packaging effects on the OLED display device 4, in some embodiments of the present disclosure, a packaging cover plate 9 may be adhered to the surface of the OLED display device 4 which has been covered with the packaging film 5. As shown in FIGS. 4 and 5, when the packaging cover plate 9 is disposed on the surface of the OLED display device 4, the packaging method of OLED display device is as follows.

In some embodiments of the present disclosure, after forming the packaging film 5 which covers all regions of the substrate 1 and before removing the sacrificial layer 3, the packaging method of OLED display device further comprises:

step 1041, forming an adhering layer on a part of the packaging film 5 positioned in the package region; and step 1042, covering the adhering layer with the packaging cover plate 9.

Specifically, after the packaging film 5 is formed, the adhering layer may be directly formed on the part of the packaging film 5 positioned in the package region, and then covered with the packaging cover plate 9, and finally the sacrificial layer 3 is removed. In such a way, the sacrificial layer 3 is removed after the packaging cover plate 9 is adhered, so that removal of the sacrificial layer 3 hardly affects the OLED display device 4, which guarantees the packaging effects on the OLED display device 4.

In some embodiments of the present disclosure, after removing the sacrificial layer 3, the packaging method of OLED display device further comprises:

step 1051, cleaning the substrate 1 from which the sacrificial layer 3 has been removed;

step 1052, forming an adhering layer on a part of the packaging film 5 positioned in the package region; and step 1053, covering the adhering layer with the packaging cover plate 9.

Specifically, the sacrificial layer 3 may be firstly removed, the substrate 1 from which the sacrificial layer 3 has been removed is cleaned and dried, and then the adhering layer is formed on the part of the packaging film 5 positioned in the package region, and is covered with the packaging cover plate 9. Since removal of the sacrificial layer 3 is performed before disposing the packaging cover plate 9 and is likely to generate residual impurities, the substrate 1 from which the sacrificial layer 3 has been removed needs to be cleaned after removal of the sacrificial layer 3 so as to wash off the generated residual impurities, and then the cleaned substrate 1 is dried to remove moisture therefrom; after the process of cleaning and drying are finished, operations of forming the adhering layer and disposing the packaging cover plate 9 are performed, which also guarantees the packaging effects on the OLED display device 4.

In some embodiments of the present disclosure, the package region of the substrate 1 includes a display region and a non-display region around the display region. As for the above two implementations, optionally, as shown in FIG. 4, the adhering layer comprises a filler layer 7 positioned in the display region, and a sealant layer 6 positioned in the non-display region of the substrate 1; or, as shown in FIG. 5, the adhering layer is a surface mount adhesive layer 8. For both of the aforesaid two options of the adhering layer, the packaging cover plate 9 may be a metal cover plate, a glass cover plate or a flexible plastic cover plate. Furthermore, as for both of the aforesaid two implementations, the adhering layer needs to be cured after being covered with the packaging cover plate 9, so as to enable the packaging cover plate 9 to be firmly disposed on the OLED display device 4.

In some embodiments of the present disclosure, there are various methods of forming the sacrificial layer 3 on the bonding electrode lead 2. A specific formation method will be described below, but makes no limitation herein.

In some embodiments of the present disclosure, a method of forming the sacrificial layer 3 on the bonding electrode lead 2 comprises:

step 1021', forming a sacrificial film by using a photosensitive adhesive;

step 1022', irradiating the sacrificial film with ultraviolet light to form a cured sacrificial film;

step 1023', patterning the cured sacrificial film to form the sacrificial layer 3; and step 1024', cleaning the substrate 1 on which the sacrificial layer is formed.

Specifically, in step 1021', the sacrificial film may be formed by means of coating and may cover all regions of the substrate 1. In step 1022', the sacrificial film may be cured with various methods, such as ultraviolet irradiation. In step 1023', the cured sacrificial film is coated with a layer of photoresist, and the photoresist is exposed with a mask to form a photoresist removing region and a photoresist retaining region, wherein the photoresist retaining region corresponds to a region of a pattern of the sacrificial layer 3, and the photoresist removing region corresponds to a region beyond the region of a pattern of the sacrificial layer 3; a development process is performed to completely remove the photoresist from the photoresist removing region, while a thickness of the photoresist in the photoresist retaining region is kept unchanged; and an etching process is performed to completely remove a part of the sacrificial film from the photoresist removing region and stripping the residual photoresist, so as to form the sacrificial layer 3. Since residual impurities are generated when patterning the sacrificial film in step 1023', the substrate 1 on which the sacrificial layer 3 is formed needs to be cleaned in step 1024' to wash off the residual impurities, so as to guarantee the packaging effects on the OLED display device 4.

In some embodiments of the present disclosure, a method of forming the sacrificial layer 3 on the bonding electrode lead 2 comprises:

step 1021″, forming a pattern of sacrificial film with an organic solution by means of inkjet printing; and step 1022″, curing the pattern of sacrificial film to form the sacrificial layer 3.

Specifically, in step 1021″, an organic adhesive solution is prepared by using acrylic organic adhesives or epoxy resin organic adhesives, and is sprayed by means of inkjet printing on the bonding region where the bonding electrode lead 2 is positioned, so as to form the pattern of sacrificial film. In step 1022″, the pattern of sacrificial film is cured by means of heating or infrared irradiation, so as to form the sacrificial layer 3.

In some embodiments of the present disclosure, the packaging film 5 which covers all regions of the substrate 1 is a single-layer inorganic packaging film. Specifically, in the step of forming the packaging film 5, no mask is used, and a single-layer high water and oxygen barrier film of SiNx, SiOx, SiON or AlOx is directly deposited by means of CVD or ALD to serve as the single-layer inorganic packaging film.

Figure 8:
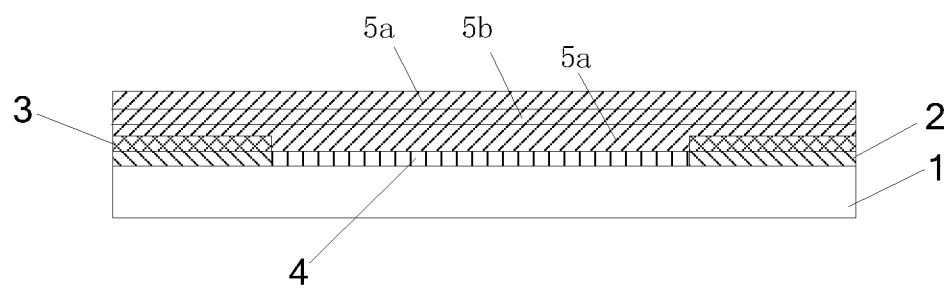
FIG. 8 is a schematic diagram of a package structure for OLED display device provided by some embodiments of the present disclosure.

In some embodiments of the present disclosure, as shown in FIG. 8, the packaging film 5 which covers all regions of the substrate 1 is a multilayer packaging film composed of alternately stacked inorganic packaging films 5a and organic packaging films 5b, with the inorganic packaging film 5a completely covering the organic packaging film 5b. Specifically, in the step of forming the packaging film 5, no mask is used, and the multilayer packaging film composed of alternately stacked inorganic packaging films 5a and organic packaging films 5b are directly deposited by means of CVD (or ALD, or inkjet printing), wherein the inorganic packaging film 5a may be a high water and oxygen barrier film of SiNx, SiOx, SiON or AlOx. Optionally, at least one of the inorganic packaging films 5a in the multilayer packaging film is in direct contact with the OLED display device 4, and at least one of the inorganic packaging films 5a covers the organic packaging film 5b completely, so as to prevent the organic packaging film 5b from being exposed, thereby guaranteeing the packaging effects of the packaging film 5. Moreover, the multilayer packaging film comprises both the inorganic packaging films 5a and the organic packaging films 5b, and thus has less stress, so that the package life of the packaging film 5 is effectively prolonged.

The multilayer packaging film may be arranged as shown in FIG. 8 to comprise two inorganic packaging films 5a and one organic packaging film 5b. It should be noted that the present disclosure makes no limitation to numbers of the inorganic packaging films 5a and the organic packaging films 5b, as long as the inorganic packaging films 5a and the organic packaging films 5b are alternately stacked, at least one of the inorganic packaging films 5a is in direct contact with the OLED display device 4, and at least one of the inorganic packaging films 5a covers the organic packaging film 5b completely.

In some embodiments of the present disclosure, as shown in FIG. 8, an orthographic projection of the organic packaging film 5b on the substrate 1 falls within an orthographic projection of the inorganic packaging film 5a on the substrate 1.

Some embodiments of the present disclosure further provide a package structure for OLED display device, which is manufactured with the aforesaid packaging method of OLED display device, and comprises the packaging film 5 covering the OLED display device 4 and exposing the bonding electrode lead 2 positioned in the bonding region. The package structure for OLED display device, which is manufactured with the aforesaid packaging method of OLED display device, is capable of providing guaranteed packaging effects and effectively prolonged service life of the OLED display device.

Some embodiments of the present disclosure further provide a display device, comprising the aforesaid package structure for OLED display device and a driving chip bonded with the bonding electrode lead 2 therein. Specifically, after the OLED display device 4 is packaged, the bonding electrode lead 2 in the bonding region is exposed, and bonding of the driving chip and a flexible circuit board is performed on the bonding electrode lead 2 to complete manufacturing of the display device. Since the display device further provided by the embodiments of the present disclosure comprises the package structure for OLED display device, the display device has good packaging effects and effectively prolonged service life.

The display device may be any product or component having a display function, such as a TV, a display, a digital photo frame, a mobile phone and a tablet computer, wherein the display device further comprises a flexible circuit board, a printed circuit board and a back plate.

In the description of the aforesaid implementations, the specific features, structures, materials or characteristics may be combined in proper ways in any one or more embodiments or examples.

It may be understood that, the above embodiments are merely the exemplary embodiments for illustrating a principle of the present disclosure, but the present disclosure is not limited thereto. Those skilled in the art may make various modifications and improvements without departing from the spirit and essence of the present disclosure, and these modifications and improvements may also fall into the scope of the present disclosure. Therefore, the protection scope of the present disclosure should be subject to the protection scope of the claims.

What is claimed is:

1. A packaging method of OLED display device, comprising:
   providing a substrate comprising a package region and a bonding region around the package region, the bonding region being provided with a bonding electrode lead;
   forming a sacrificial layer on the bonding electrode lead;
   forming an OLED display device in the package region;
   forming a packaging film which covers the package region and the bonding region; and
   removing the sacrificial layer to separate the sacrificial layer and a part of the packaging film positioned on the sacrificial layer from the substrate;
   wherein, after forming the packaging film which covers the package region and the bonding region and before removing the sacrificial layer, the packaging method further comprises:
   forming an adhering layer on a part of the packaging film positioned in the package region; and
   covering the adhering layer with a packaging cover plate.

2. The packaging method of OLED display device of claim 1, wherein, after removing the sacrificial layer, the packaging method further comprises:
   cleaning the substrate from which the sacrificial layer has been removed; and
   forming an adhering layer on a part of the packaging film positioned in the package region; and
   covering the adhering layer with a packaging cover plate.

3. The packaging method of OLED display device of claim 2, wherein the package region comprises a display region and a non-display region around the display region, and the adhering layer comprises a filler layer positioned in the display region and a sealant layer positioned in the non-display region of the substrate; or, the adhering layer is a surface mount adhesive layer.

4. The packaging method of OLED display device of claim 3 wherein the step of removing the sacrificial layer comprises:

soaking the sacrificial layer in an alkaline solution, or mechanically stripping the sacrificial layer, so as to remove the sacrificial layer.

5. The packaging method of OLED display device of claim 1, wherein the package region comprises a display region and a non-display region around the display region, and the adhering layer comprises a filler layer positioned in the display region and a sealant layer positioned in the non-display region of the substrate; or, the adhering layer is a surface mount adhesive layer.

6. The packaging method of OLED display device of claim 1, wherein the step of forming the sacrificial layer on the bonding electrode lead comprises:

forming a sacrificial film by using photosensitive adhesive;

irradiating the sacrificial film with ultraviolet light to form a cured sacrificial film;

patterning the cured sacrificial film to form the sacrificial layer; and cleaning the substrate on which the sacrificial layer is formed.

7. The packaging method of OLED display device of claim 6 wherein the step of removing the sacrificial layer comprises:

soaking the sacrificial layer in an alkaline solution, or mechanically stripping the sacrificial layer, so as to remove the sacrificial layer.

8. The packaging method of OLED display device of claim 1, wherein the step of forming the sacrificial layer on the bonding electrode lead comprises:

forming a pattern of sacrificial film with an organic solution by means of inkjet printing; and curing the pattern of sacrificial film to form the sacrificial layer.

9. The packaging method of OLED display device of claim 1, wherein the step of forming the packaging film which covers the package region and the bonding region comprises:

forming a single-layer inorganic packaging film; or, forming a multilayer packaging film composed of alternately stacked inorganic packaging films and organic packaging films, with at least one of the inorganic packaging films completely covering the organic packaging films.

10. The packaging method of OLED display device of claim 9, wherein at least one of the inorganic packaging films is in direct contact with the OLED display device.

11. The packaging method of OLED display device of claim 10, wherein an orthographic projection of the organic packaging film on the substrate falls within an orthographic projection of the inorganic packaging film on the substrate.

\* \* \* \* \*